United States Patent
Shimao et al.

(10) Patent No.: US 11,824,516 B2
(45) Date of Patent: Nov. 21, 2023

(54) PIEZOELECTRIC DEVICE AND MANUFACTURING METHOD OF THE SAME

(71) Applicant: NIHON DEMPA KOGYO CO., LTD., Tokyo (JP)

(72) Inventors: Kenji Shimao, Saitama (JP); Tetsuya Watanabe, Saitama (JP); Koji Toshikawa, Saitama (JP); Hirokazu Iwata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 475 days.

(21) Appl. No.: 17/080,860

(22) Filed: Oct. 27, 2020

(65) Prior Publication Data
US 2021/0135650 A1    May 6, 2021

(30) Foreign Application Priority Data

Nov. 1, 2019    (JP) .................... 2019-199728

(51) Int. Cl.
| | |
|---|---|
| *H03H 9/19* | (2006.01) |
| *H03H 9/10* | (2006.01) |
| *H03H 3/02* | (2006.01) |
| *H03H 9/02* | (2006.01) |
| *H03H 9/05* | (2006.01) |
| *H10N 30/02* | (2023.01) |

(Continued)

(52) U.S. Cl.
CPC ............ *H03H 9/1021* (2013.01); *H03H 3/02* (2013.01); *H03H 9/02023* (2013.01); *H03H 9/0509* (2013.01); *H03H 9/19* (2013.01); *H10N 30/02* (2023.02); *H10N 30/082* (2023.02); *H10N 30/88* (2023.02); *H03H 2003/022* (2013.01)

(58) Field of Classification Search
CPC ............. H03H 9/1021; H03H 9/02023; H03H 9/0509; H03H 9/19; H03H 2003/022; H03H 3/02; H10N 30/02; H10N 30/082; H10N 30/088
See application file for complete search history.

(56) References Cited

U.S. PATENT DOCUMENTS

| | | | |
|---|---|---|---|
| 10,250,225 B2 * | 4/2019 | Sato .................... | H03H 9/02023 |
| 10,263,597 B2 * | 4/2019 | Sato .................... | H03H 9/19 |

(Continued)

FOREIGN PATENT DOCUMENTS

JP    2016197778    11/2016

*Primary Examiner* — J. San Martin
(74) *Attorney, Agent, or Firm* — JCIPRNET

(57) ABSTRACT

A piezoelectric device includes a container and an AT-cut crystal element. The AT-cut crystal element has at least one side surface intersecting with a Z'-axis of the crystallographic axis of the crystal constituted of three surfaces. The first surface is a surface equivalent to a surface formed by rotating the principal surface by 4°±3.5° with an X-axis of the crystal as a rotation axis. The second surface is a surface equivalent to a surface formed by rotating the principal surface by −57°±5° with the X-axis. The third surface is a surface equivalent to a surface formed by rotating the principal surface by −42°±5° with the X-axis. When two corner portions on a side of a second side opposed to the first side of the AT-cut crystal element are viewed in plan view, each of the two corner portions have an approximately right angle.

6 Claims, 8 Drawing Sheets

(51) Int. Cl.
  *H10N 30/082* (2023.01)
  *H10N 30/88* (2023.01)

(56) References Cited

U.S. PATENT DOCUMENTS

| | | | | |
|---|---|---|---|---|
| 10,333,489 | B2* | 6/2019 | Shimao | H03H 3/02 |
| 10,529,910 | B2* | 1/2020 | Sato | H10N 30/88 |
| 10,659,005 | B2* | 5/2020 | Kuwahara | H03H 9/02133 |
| 10,819,307 | B2* | 10/2020 | Sato | H03H 9/132 |
| 2004/0095044 | A1* | 5/2004 | Yagishita | H03H 9/1021 |
| | | | | 310/348 |
| 2009/0102322 | A1* | 4/2009 | Akane | H03H 9/1021 |
| | | | | 310/348 |
| 2009/0256449 | A1* | 10/2009 | Nishimura | H03H 9/0519 |
| | | | | 29/25.35 |
| 2018/0226944 | A1* | 8/2018 | Kidu | H03H 9/1021 |
| 2019/0097123 | A1* | 3/2019 | Watanabe | H03H 9/19 |
| 2019/0123714 | A1* | 4/2019 | Kizu | H03H 9/19 |
| 2019/0326882 | A1* | 10/2019 | Toshikawa | C30B 29/18 |
| 2022/0263487 | A1* | 8/2022 | Watanabe | H10N 30/082 |

\* cited by examiner

COMPARATIVE EXAMPLE

PIEZOELECTRIC DEVICE AND MANUFACTURING METHOD OF THE SAME

CROSS-REFERENCE TO RELATED APPLICATIONS

This application is based on and claims priority under 35 U.S.C. § 119 to Japanese Patent Application No. 2019-199728, filed on Nov. 1, 2019. The entire content of which is incorporated herein by reference and made a part of this specification.

TECHNICAL FIELD

This disclosure relates to a piezoelectric device, such as a crystal unit, a crystal controlled oscillator including the crystal unit, and a crystal unit that uses a temperature sensor, such as a thermistor and a PN diode, together, and a manufacturing method of the same.

DESCRIPTION OF THE RELATED ART

A photolithography technique and a wet etching technique have been used to achieve a further compact crystal unit, as one kind of a piezoelectric device.

For example, Japanese Unexamined Patent Application Publication No. 2016-197778 by the Applicant of this application discloses a piezoelectric device using the above techniques. Specifically, as illustrated in FIG. 1A to FIG. 1C in Japanese Unexamined Patent Application Publication No. 2016-197778, the piezoelectric device including the following AT-cut crystal element has been disclosed. The AT-cut crystal element in which at least one side surface intersecting with a Z'-axis of a crystallographic axis of a crystal is constituted of three first to third surfaces. The first surface is a surface formed by rotating an X-Z' surface (principal surface) expressed by the crystallographic axes of the crystal of this crystal element by 4°±3.5° with an X-axis of the crystal as a rotation axis, the second surface is a surface equivalent to a surface formed by rotating the principal surface by −57°±5° with the X-axis of the crystal as a rotation axis, and the third surface is a surface equivalent to a surface formed by rotating the principal surface by −42°±5° with the X-axis of the crystal as a rotation axis.

According to this piezoelectric device, an unnecessary vibration other than an original vibration of an AT-cut crystal unit can be reduced compared with that of the conventional one, and therefore an impedance of the crystal unit, namely, a crystal impedance (hereinafter also referred to as CI) can be improved compared with that of the conventional one.

Although the piezoelectric device disclosed in Japanese Unexamined Patent Application Publication No. 2016-197778 improves the CI, studies by the inventor of this application have proved that further improvement in CI is achieved. That is, the piezoelectric device disclosed in Japanese Unexamined Patent Application Publication No. 2016-197778 includes the crystal element having the predetermined first to third surfaces, and to obtain the predetermined first to third surfaces, a process that etches a quartz-crystal wafer over a long period of time has been employed. Therefore, when a distal end side of this crystal element, that is, a side opposite to a side supported by a conductive adhesive of the crystal element, is viewed in plan view, regions heading for both corner portions from the center of this distal end are etched in an approximately triangle shape, and an area of the crystal element is reduced by the amount (see a comparative example described later and FIG. 6 and FIG. 7B). With the AT-cut crystal element, considering that the CI is likely to be better as the planer area of the crystal element is wide, the piezoelectric device disclosed in Japanese Unexamined Patent Application Publication No. 2016-197778 has a room for improvement.

A need thus exists for a piezoelectric device and a manufacturing method of the same which are not susceptible to the drawback mentioned above.

SUMMARY

An embodiment of this disclosure provides a piezoelectric device that includes: a container; and an AT-cut crystal element. The AT-cut crystal element has an X-Z' surface expressed by crystallographic axes of a crystal as a principal surface. A planar shape of the AT-cut crystal element is a quadrangle. The AT-cut crystal element has at least one side surface intersecting with a Z'-axis of a crystallographic axis of the crystal constituted of three surfaces. The three surfaces are first to third surfaces met in an order of the first to third surfaces. The first surface is a surface equivalent to a surface formed by rotating the principal surface by 4°±3.5° with an X-axis of the crystal as a rotation axis. The second surface is a surface equivalent to a surface formed by rotating the principal surface by −57°±5° with the X-axis of the crystal as a rotation axis. The third surface is a surface equivalent to a surface formed by rotating the principal surface by −42°±5° with the X-axis of the crystal as a rotation axis. The AT-cut crystal element is connected and secured to the container with a conductive adhesive on a side of a first side among two sides parallel to the Z'-axis. When two corner portions on a side of a second side opposed to the first side of the AT-cut crystal element are viewed in plan view, each of the two corner portions have an approximately right angle.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Figure 1A:
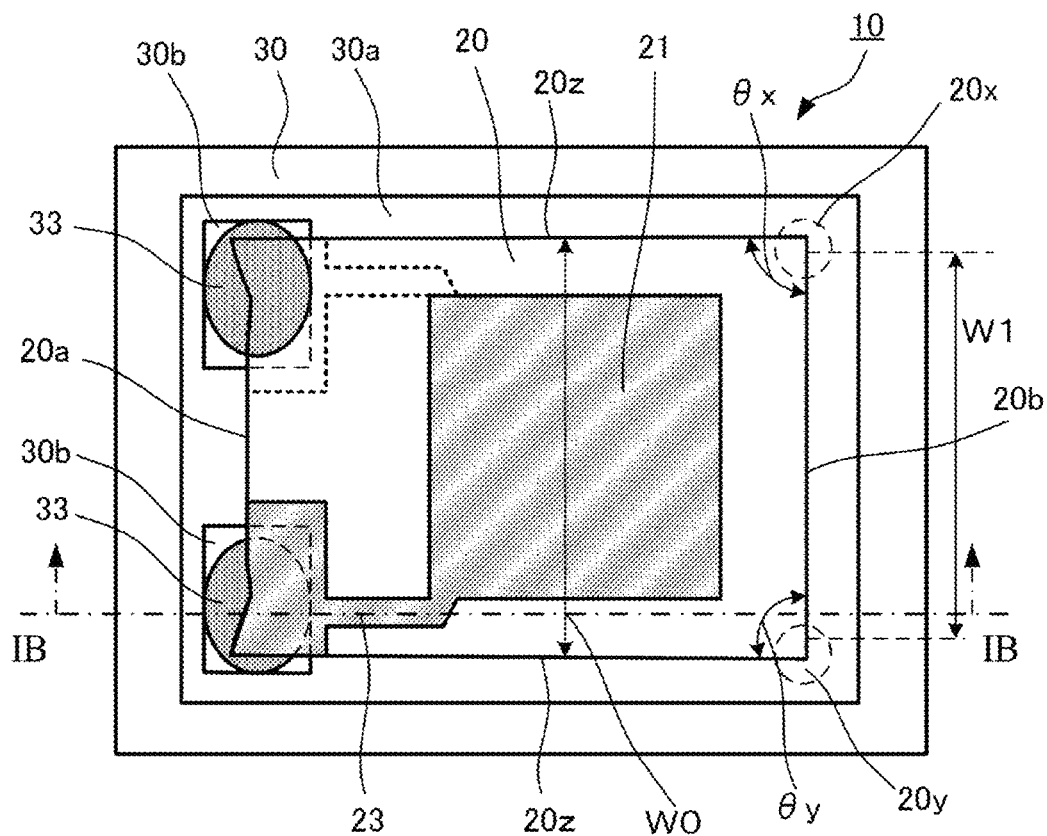
FIG. 1A and FIG. 1B are explanatory drawings of a piezoelectric device 10 according to an embodiment of the disclosure.

Hereinafter, embodiments of a piezoelectric device and a manufacturing method of the same of this disclosure will be described with reference to the drawings. Each drawing used in the descriptions is merely illustrated schematically for ensuring understanding these disclosures. In each drawing used in the descriptions, like reference numerals designate identical elements, and therefore such elements will not be further elaborated here in some cases. Shapes, dimensions, materials, and the like described in the following descriptions are merely preferable examples within the scope of this disclosure. Therefore, this disclosure is not limited to only the following embodiments.

1. Description of Piezoelectric Device

Figure 1B:
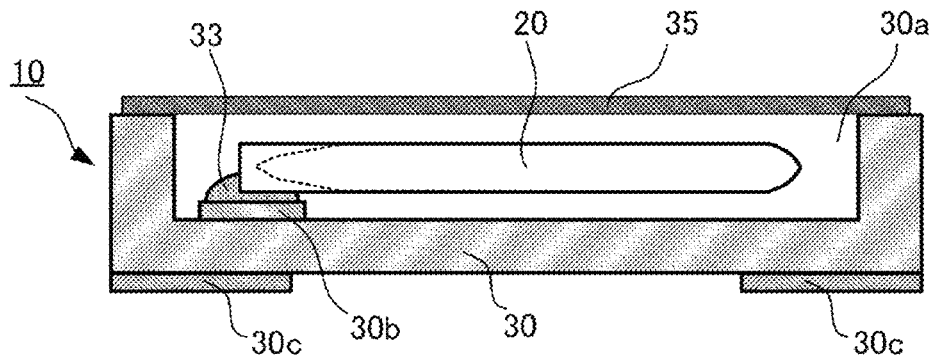
Figure 2C:
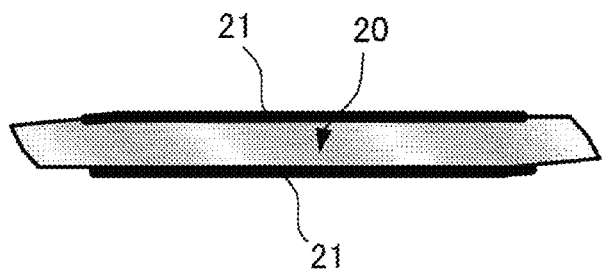
FIG. 2A to FIG. 2C are explanatory drawings of an AT-cut crystal element 20 provided with the piezoelectric device 10 according to an embodiment of the disclosure.
Figure 2B:
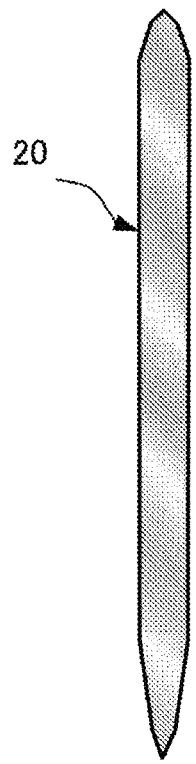
Figure 2A:
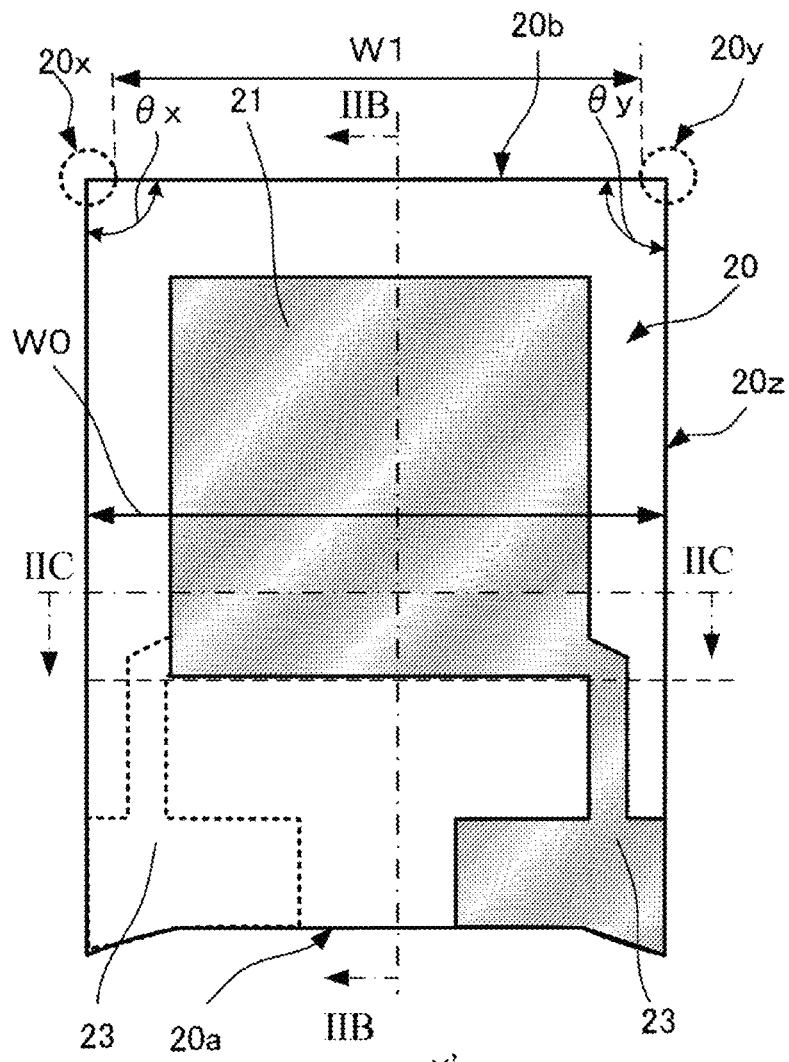
Figure 3A:
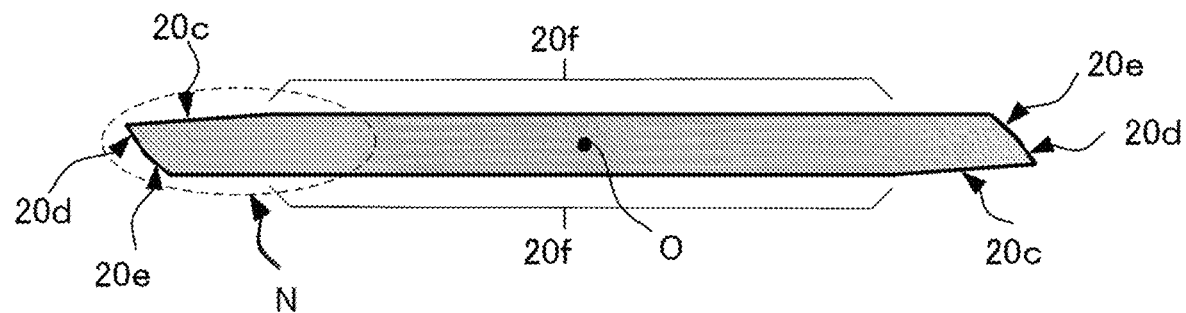
FIG. 3A and FIG. 3B are explanatory drawings of a side surface intersecting with especially a Z'-axis of the AT-cut crystal element 20.
Figure 3B:
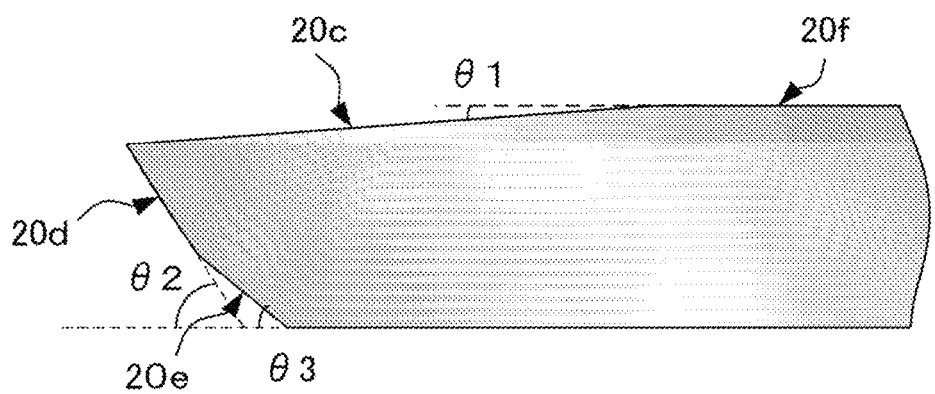

First, with reference to FIG. 1A to FIG. 3B, a piezoelectric device 10 of an embodiment of the disclosure will be described. Here, FIG. 1A is a top view of the piezoelectric device 10, and FIG. 1B is a cross-sectional view of the piezoelectric device 10 along the line IB-IB in FIG. 1A. Note that, FIG. 1A omits an illustration of a lid member 35 provided with the piezoelectric device 10 in FIG. 1B. FIG. 2A is a top view of the AT-cut crystal element 20 provided with the piezoelectric device 10 of an embodiment of the disclosure. FIG. 2B is a cross-sectional view of the crystal element 20 along the line IIB-IIB in FIG. 2A. FIG. 2C is a cross-sectional view of the crystal element 20 along the line IIC-IIC in FIG. 2A. FIG. 3A is a drawing describing a side surface intersecting with a Z'-axis of a crystal of the AT-cut crystal element 20, and FIG. 3B is a drawing illustrating an enlarged part "N" in FIG. 3A. The coordinate axes X, Y', and Z' illustrated in FIG. 2A each indicate a crystallographic axis of the crystal in the AT-cut crystal element 20 (hereinafter may be abbreviated as the crystal element 20).

A planar shape of the crystal element 20 of this embodiment is a quadrangle (such as, rectangular shape), and the crystal element 20 is an AT-cut crystal element having long sides parallel to the X-axis of the crystal and short sides parallel to the Z'-axis of the crystal.

This crystal element 20 includes excitation electrodes 21 and extraction electrodes 23 on both principal surfaces. The extraction electrodes 23 are extracted from the excitation electrodes 21 to the proximity of both ends of first sides 20a as one sides of the crystal element 20.

As illustrated in FIG. 1A, this crystal element 20 is mounted in a depressed portion 30a of a container 30. Specifically, this crystal element 20 is secured to support pads 30b of the container 30 on the first side 20a side and near both ends along the first side 20a with, for example, conductive adhesives 33. Therefore, the crystal element 20 is cantilevered and held to the container 30 on the first side 20a side.

As the container 30, for example, a package made of ceramic is usable. External mounting terminals 30c to connect this piezoelectric device 10 to another electronic device are disposed on a bottom surface outer side of this container 30. The support pads 30b and the external mounting terminals 30c are connected with a via-wiring (not illustrated).

In a preferred embodiment, a lid member 35 is joined to a dike surrounding the depressed portion 30a of the container 30, and thus the crystal element 20 is sealed in the container 30.

Furthermore, this crystal element 20 has the side surfaces intersecting with the Z'-axis of the crystal with the following structure.

As illustrated in FIG. 3A and FIG. 3B, the side surfaces (Z'-surfaces) intersecting with the Z'-axis of the crystal of the crystal element 20 are side surfaces each constituted of three surfaces, i.e., a first surface 20c, a second surface 20d, and a third surface 20e. Moreover, the first surface 20c is a surface that meets a principal surface 20f of this crystal element 20, and is a surface equivalent to a surface formed by rotating the principal surface 20f by θ1 with the X-axis of the crystal as a rotation axis.

In this crystal element 20, the first surface 20c, the second surface 20d, and the third surface 20e are met in this order. Moreover, the second surface 20d is a surface equivalent to a surface formed by rotating the principal surface 20f by θ2 with the X-axis of the crystal as a rotation axis, and the third surface 20e is a surface equivalent to a surface formed by rotating the principal surface 20f by θ3 with the X-axis of the crystal as a rotation axis. The two side surfaces are in a relationship of point symmetry with respect to a center point "O" of the crystal element 20.

It has been found through experiments by the Applicant that, the above-described angles θ1, θ2, and θ3 are preferably as follows.

$\theta1 = 4° \pm 3.50$,
$\theta2 = -57° \pm 5°$,
$\theta3 = -42° \pm 5°$,
and more preferably
$\theta1 = 4° 30$,
$\theta2 = -57° \pm 3°$, and
$\theta3 = -42° \pm 3°$.

With the crystal element 20 having the side surfaces that have been described using FIG. 3A and FIG. 3B, the side surfaces have a unique beak shape, and this allows damping an unnecessary vibration propagating in the Z'-direction and allows contributing to improvement in a property of the piezoelectric device. Since Japanese Unexamined Patent Application Publication No. 2016-197778 by the Applicant discloses this structure, the detailed description is omitted here.

As illustrated in FIG. 2B, the cross-sectional surface (the cross-sectional surface along the line IIB-IIB) along the X-axis of the crystal of the crystal element 20 has a projecting shape on respective both end sides along the X-axis direction.

Furthermore, as a feature of this disclosure, in the crystal element 20, two corner portions 20x, 20y on the side of a second side 20b of the crystal element 20 each have an approximately right angle in plan view.

Specifically, as illustrated in FIG. 1A and FIG. 2A, an angle θx where the short side, namely, the second side 20b, intersects with a long side 20z, which are two sides constituting the corner portion 20x, of the crystal element 20, and an angle θy where the short side, namely, the second side 20b, intersects with the long side 20z, which are two sides constituting the corner portion 20y, of the crystal element 20 are angles each preferably in a range from 85 to 90 degrees in plan view, and further preferably in a range from 87 to 90 degrees. Such an angle allows improving a CI of the piezoelectric device 10 compared with a case other than that (for details, see the working example).

Note that, while the angles θx, θy may be same or different, typically, the angles θx, θy slightly differ due to anisotropy of the crystallographic axes of the crystal.

In view of a dimension C as a notation for C-chamfering of the two corner portions, the approximately right angles of the two corner portions 20x, 20y are preferably 20 μm or less. Such a dimension C allows improving the CI of the piezoelectric device 10 compared with a case other than that (for details, see the working example).

Additionally, in the crystal element 20, the second side 20b has a linear shape between the two corner portions 20x, 20y. When a length of a part of the linear shape of the second side 20b is denoted as W1, and a width dimension along the Z'-direction of the crystal element 20, that is, a width dimension near the center of the crystal element 20, is denoted as W0, W1/W0 is preferably 0.93 or more, and W1/W0 is more preferably 0.96 or more. Note that, W1/W0 is "1" at the maximum. Setting the value of W1/W0 in the above-described range allows improving the CI of the piezoelectric device 10 compared with a case other than that (for details, see the working example).

The length W1 of the part of the linear shape changes by a value of a dimension W (see FIG. 4C) of a fourth pattern and a period during which a quartz-crystal wafer is etched with hydrofluoric acid-based etchant described in the manufacturing method described later. Since W1/W0 is preferably "1" or close to "1", the value of the dimension W of the fourth pattern and the period during which the quartz-crystal wafer is etched with the hydrofluoric acid-based etchant may be set such that W1/W0 becomes close to "1".

2. Description of Method for Manufacturing Piezoelectric Device

Figure 4A:
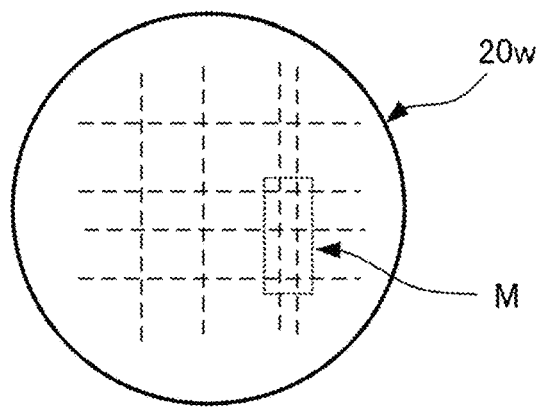
FIG. 4A, FIG. 4B, and FIG. 4C are drawings describing a main part of a manufacturing method of the piezoelectric device 10 according to an embodiment of the disclosure.
Figure 4B:
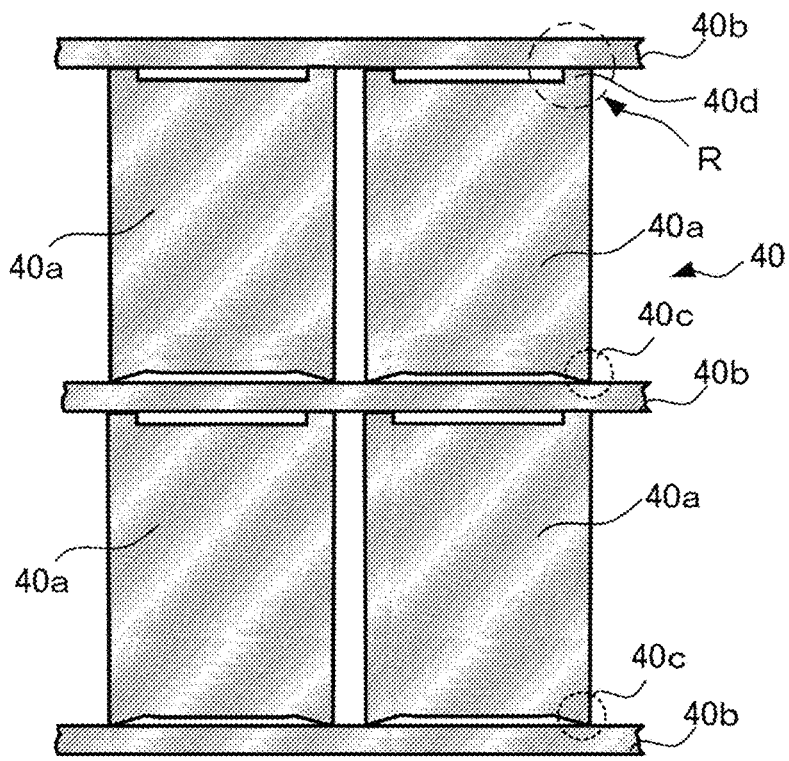
Figure 4C:
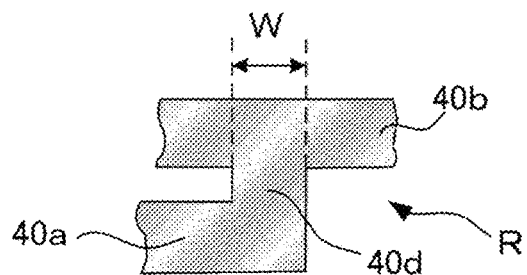
Figure 5A:
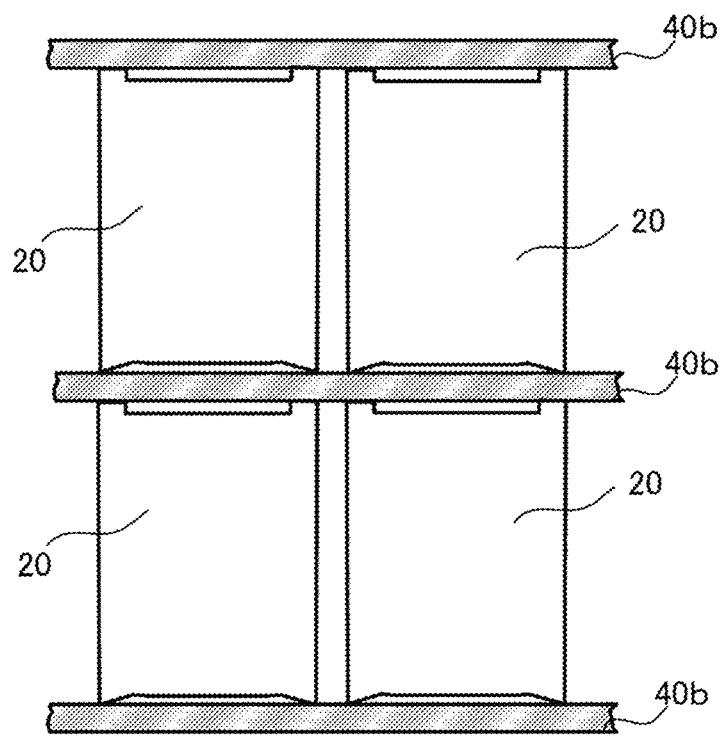
FIG. 5A and FIG. 5B are explanatory drawings continuous with FIG. 4B of the manufacturing method of the piezoelectric device 10 according to an embodiment of the disclosure.
Figure 5B:
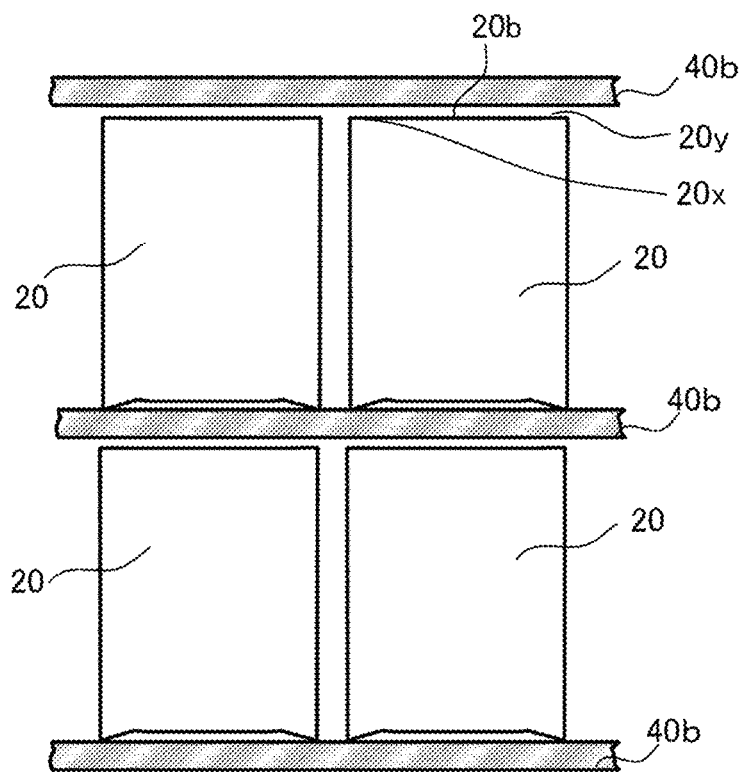

Next, with reference to FIG. 4A to FIG. 4C and FIG. 5A and FIG. 5B, a preferred method for manufacturing the piezoelectric device 10 of the embodiment will be described. FIG. 4A to FIG. 4C are drawings describing a main part of a step of manufacturing the crystal element 20 used for the piezoelectric device 10. Especially, FIG. 4A is a plan view describing a quartz-crystal wafer 20w in a middle state. FIG. 4B is a drawing illustrating a state in which an etching resist mask 40 is formed on this quartz-crystal wafer and is a plan view illustrating an enlarged part "M" in FIG. 4A. FIG. 4C is a drawing describing means to form the corner portions 20x, 20y of the crystal element 20 in the approximately right angles and is a plan view illustrating an enlarged part "R" in FIG. 4B. FIG. 5A and FIG. 5B are drawings describing a state in which the step proceeds from the state of FIG. 4B.

The disclosure of the manufacturing method of this application manufactures the crystal element 20 by a photolithography technique and a wet etching technique.

Specifically, a process that forms the etching resist mask 40 (see FIG. 4B) for wet etching that includes first mask portions 40a, second mask portions 40b, third mask portions 40c, and fourth mask portions 40d on the quartz-crystal wafer 20w is used. The first mask portions 40a form a pattern of the AT-cut crystal elements 20 in a matrix. The second mask portions 40b extend along a direction equivalent to the Z'-axis in the matrix to form a pattern for forming crosspieces arranged in sequence along the X direction. The third mask portions 40c form a bridge pattern to hold the AT-cut crystal elements on the crosspieces after this wet etching. The fourth mask portions 40d are disposed between corner portions on the sides of the second sides of the AT-cut crystal elements and the third mask portions and have a predetermined width W to disappear the crystals at the locations at the completion of this wet etching. Here, the fourth mask portions 40d are disposed between parts corresponding to the two corner portions on the distal end side of the crystal element of the first mask portion 40a and the second mask portions 40b.

Specifically, metal films having an etching resistance property are formed on front and back surfaces of the quartz-crystal wafer 20w, photoresists are applied over the surfaces, an exposure or the like is performed on the photoresists using a photomask for forming the first to fourth mask portions, and thereafter, the metal films are selectively removed, and thus this etching resist mask 40 can be formed.

The width W (see FIG. 4C) in the direction along the Z'-axis of the crystal of the fourth mask portion 40d is configured as a predetermined width (see the working example and the like), so that the crystal part below the fourth mask portion 40d disappears after ending a second etching step described later.

Next, a first etching step that dips the quartz-crystal wafer on which the etching resist mask 40 has been formed in a hydrofluoric acid-based wet etching liquid for a predetermined period is performed. This first etching step is to form an outer shape of the crystal element 20.

Next, the first mask portions 40a and the fourth mask portions 40d are removed from the quartz-crystal wafer on which the first etching has been performed. This embodiment also removes the third mask portions 40c. Such mask portions can be processed by the well-known photolithography technique. However, as already described above, when a size of the third mask portion 40c is small, the third mask portion 40c is preferably remained without removal.

When the above-described anti-etching process has been finished, crystal parts covered with the first, second, and third mask portions are exposed (see FIG. 5A).

Next, the second etching step that dips the quartz-crystal wafer from which the first, second, and third mask portions have been removed in the hydrofluoric acid-based wet etching liquid for a predetermined period is performed. This second etching step is to adjust a frequency of the crystal element 20 and form predetermined first to third surfaces on the side surface intersecting with the Z'-axis of a crystal axis. Since the width W was configured as the predetermined width, crystal parts exposed by removing the above-described fourth mask portions 40d disappear in this second etching. In view of this, since both corner portions 20x, 20y of the second side 20b as the side on the side not secured to the container of the crystal element 20 appear as the corner portions for the first time around the end of the second etching, the corner portions 20x, 20y have the approximately right angles even after the wet etching, and the part between these corner portions 20x, 20y of the second side 20b has the linear shape.

An excitation electrode and an extraction electrode are formed on the quartz-crystal wafer on which this second etching step has been performed, this AT-cut crystal element is separated from the quartz-crystal wafer on which the formation of the excitation electrode and the like has been finished, the separated crystal element is secured to the container 30 (see FIG. 1A and FIG. 1B) with the conductive adhesives, and afterwards, the container is sealed with the lid member in a state where the inside of the container is set under a predetermined atmosphere, and thus the piezoelectric device according to this disclosure can be manufactured.

3. Working Example and Comparative Example

Next, the working example and the comparative example will be described with reference to FIG. 6, FIG. 7A and FIG. 7B, and FIG. 8A and FIG. 8B.

As piezoelectric devices of the working example, a plurality of crystal elements with an oscillation frequency of 27.12 MHz, an X dimension of the crystal element 20 of about 870 µm, and a Z' dimension of the crystal element 20 of about 640 µm were manufactured by the above-described manufacturing method, the crystal elements were mounted on containers, and further the containers were sealed with lid members, thus manufacturing a plurality of the piezoelectric devices of the working example.

Additionally, although the frequency, the X dimension, and the Z' dimension were same as those of the working example, as piezoelectric devices of the comparative example, a plurality of crystal elements of the comparative example were manufactured using an etching resist mask not including the fourth mask portions 40*d* (see FIG. 4B) for manufacturing, the crystal elements were mounted in containers, and further the containers were sealed with lid members, thus manufacturing a plurality of the piezoelectric devices of the comparative example.

Figure 6:
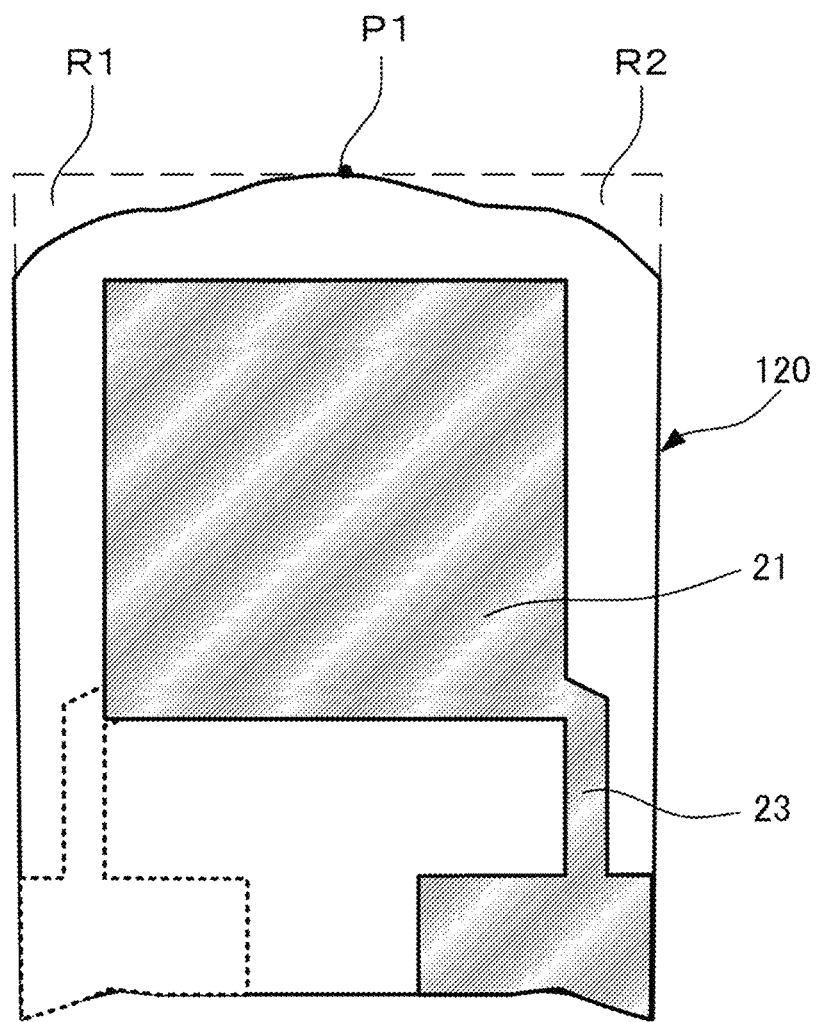
FIG. 6 is an explanatory drawing of a comparative example.
Figure 7A:
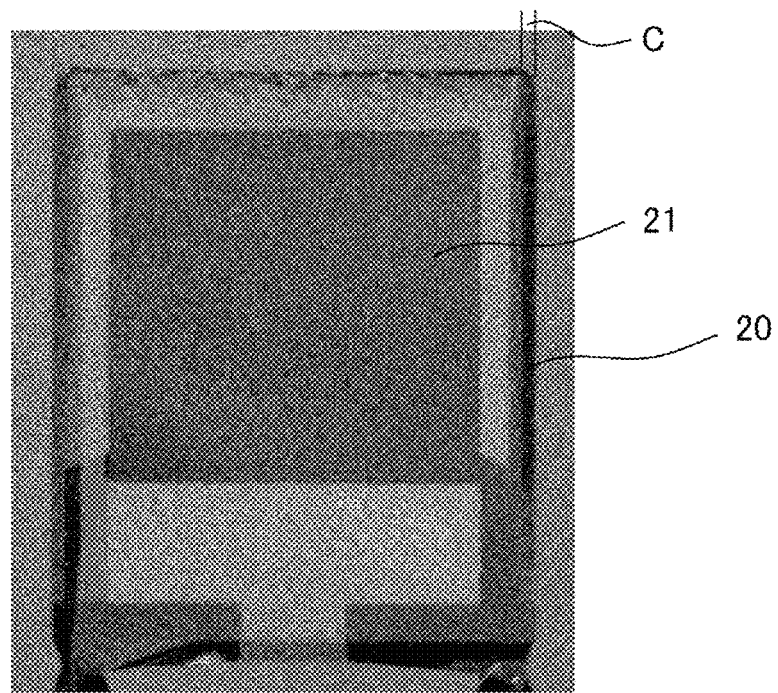
FIG. 7A is a SEM photograph of observing a crystal element of a working example from the above.
Figure 7B:
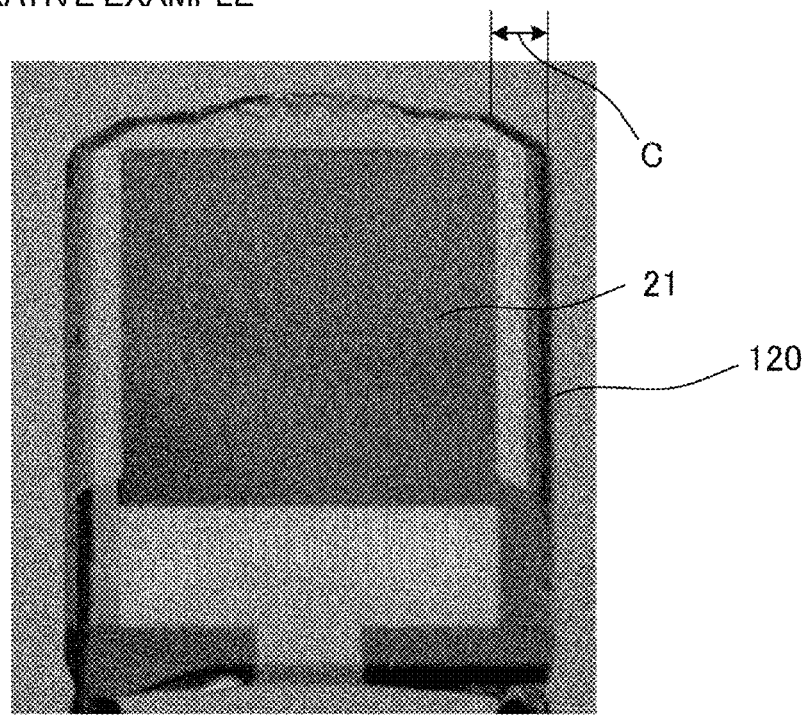
FIG. 7B is a SEM photograph of observing a crystal element of the comparative example from the above.

FIG. 6 is a plan view illustrating a crystal element 120 used in the comparative example, FIG. 7A is a SEM photograph of observing the crystal element 20 used in the working example from above, and FIG. 7B is a SEM photograph of observing the crystal element 120 used in the comparative example from above.

It is seen from FIG. 6 and FIG. 7B that, in the crystal element 120 used in the comparative example, when the distal end side, that is, a side opposite to a side supported by the conductive adhesives of the crystal element, is viewed in plan view, respective regions R1, R2 heading from a center P1 at the distal end to both corner portions are etched in approximately triangle shapes, and an area of the crystal element is reduced by the amount.

On the other hand, it is seen from FIG. 7A that the crystal element 20 used in the working example has both of the corner portions 20*x*, 20*y* on the distal end side having approximately right angles, and moreover, between both of the corner portions 20*x*, 20*y* is a linear shape. That is, it is seen that the crystal element 20 has a firm rectangular shape as viewed in plan view.

The above-described angles θx, θy (see FIG. 1A and FIG. 2A) of both of the corner portions 20*x*, 20*y* of the plurality of crystal elements 20 used in the working example were measured with a measurement microscope. It was found that the angles θx, θy were in a range from 85 to 90 degrees, and it was found that W1 was in a range from 605 µm to 632 µm. On the other hand, the aimed Z' dimension near the center of the crystal element, namely, the width dimension W0 is 640 µm, and the actual measurement found that the width dimension W0 was in a range from 638 µm to 650 µm.

Therefore, when W1/W0 is estimated from the respective actually measured values W1, W0, the lower limit is 605/650≈0.93, and the upper limit is 632/638≈0.99, and therefore it can be said that W1/W0 is from 0.93 to 0.99 in the actual product. The values of W1/W0 were mostly from 0.96 to 0.99.

Dimensions C in terms of C-chamfering of the two corner portions of the distal end portions of each of the plurality of crystal elements 20 used in the working example and the plurality of crystal elements 120 used in the comparative example were measured with a measurement microscope. That is, the dimensions C as a notation for C-chamfering at the corner portions in the SEM photographs illustrated in FIG. 7A and FIG. 7B were measured with the measurement microscope. As a result, in the crystal elements 20 of the working example, the dimensions C were from 10 µm to 18 µm, and all of them were 20 µm or less. On the other hand, in the crystal elements 120 of the comparative example, the dimensions C were from 70 µm to 95 µm, and all of them were increased seven times to nine times compared with those of the working example.

Additionally, the measurement of dimensions of the linear parts at the distal end portions of the crystal elements 120 of the comparative example found that the dimensions were narrow, from around 130 µm to 160 µm. Moreover, a part from the end of the linear parts to the corner portions of the crystal element had a sloping shoulder shape.

Figure 8A:
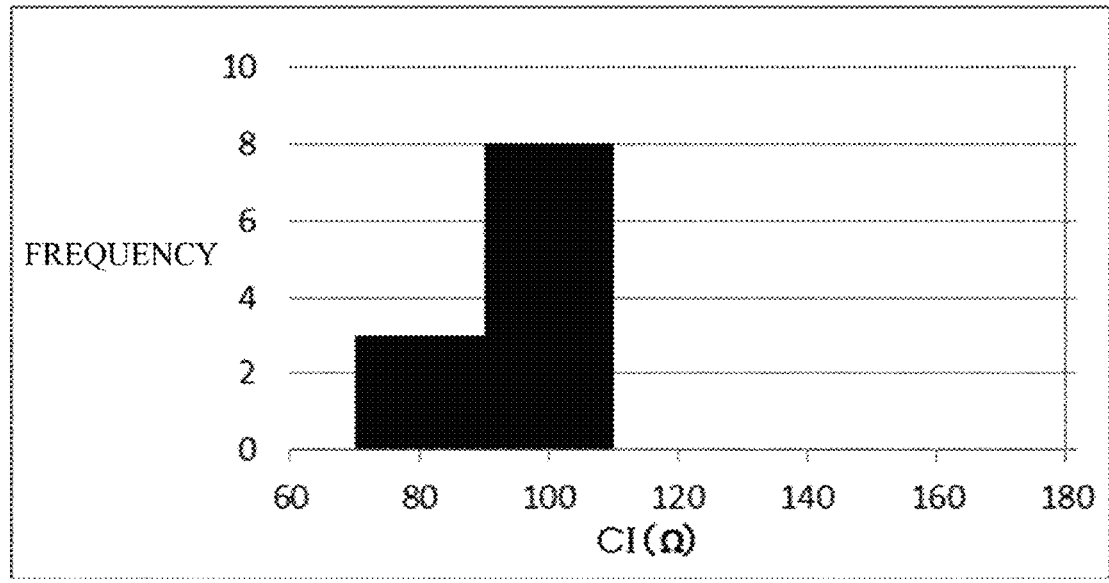
FIG. 8A is a characteristic diagram illustrating a CI distribution of the piezoelectric device of the working example.
Figure 8B:
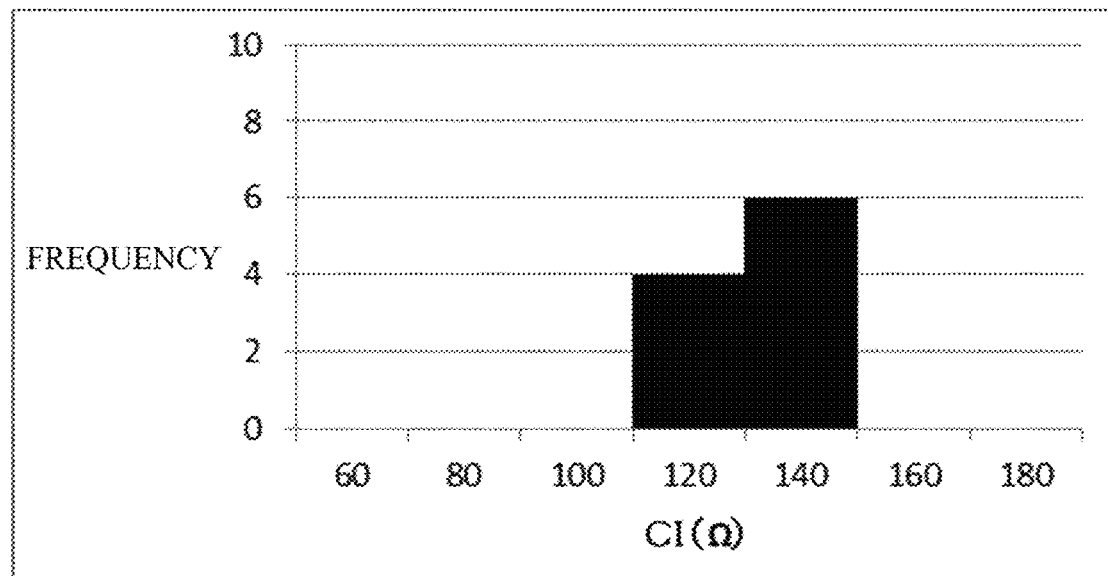
FIG. 8B is a characteristic diagram illustrating a CI distribution of the piezoelectric device of the comparative example.

Additionally, the CI was measured as electrical characteristics of the respective piezoelectric devices of the working example and the comparative example. FIG. 8A illustrates a CI distribution of the piezoelectric device of the working example, and FIG. 8B illustrates a CI distribution of the piezoelectric device of the comparative example. Both drawings plot the CI (Q) on the horizontal axis and a frequency on the vertical axis. The numbers of samples are 12 pieces for both.

In the CI distribution of the piezoelectric device of the working example, an average value was 83.5Ω and a standard deviation was 6.6Ω, and in the CI distribution of the piezoelectric device of the comparative example, the average value was 123.6Ω and the standard deviation was 13.0Ω. The average value of the CI was excellent by 40.1Ω and the standard deviation was excellent by 6.4Ω in the working example. It is seen from this result that the piezoelectric device of this disclosure is excellent compared with the conventional one.

It is seen from the result of the CI measurement that the two corner portions on the distal end side of the crystal element of this disclosure having the approximately right angles improve the CI. Specifically, it is seen that the angles θx, θy of the two corner portions on the distal end side of the crystal element, the ratio W1/W0 of the width (W1) of the linear part on the distal end side of the crystal element to the width (W0) near the center of the crystal element, and the dimension C in the above-described ranges are preferred to improve the CI.

4. Other Embodiments

While the embodiments of the respective disclosures of the piezoelectric device and the manufacturing method of the same have been described above, this disclosure is not limited to the examples. For example, the used container is not limited to the example. For example, this disclosure is applicable to a piezoelectric device having another structure, such as a piezoelectric device using a container formed of a flat plate-shaped base and a cap-shaped lid member having a depressed portion to house a crystal element. Additionally, applicable frequency and size of the crystal element are also not limited to the above-described examples. As downsizing of the crystal element proceeds, a degree of contribution of this disclosure increases.

To embody this disclosure, the approximately right angle where two sides constituting the corner portion intersect preferably has an angle in a range from 85 to 90 degrees and from 87 to 90 degrees is further preferred.

To embody this disclosure, the second side preferably has a linear shape between the two corner portions.

Moreover, when a length of a part of the linear shape of the second side is denoted as W1, and a width dimension along a Z'-direction of the AT-cut crystal element is denoted as W0, W1/W0 is preferably 0.90 or more, W1/W0 of 0.93 or more is more preferred, and W1/W0 of 0.96 or more is further preferred.

To embody this disclosure, the approximately right angles preferably have a dimension C of 20 µm or less when the dimension C is defined by a notation for C-chamfering of the two corner portions.

The disclosure of a manufacturing method of the piezoelectric device of this application manufactures the above-described piezoelectric device according to this application by a photolithography technique and a wet etching technique. The manufacturing method includes: a step of forming an etching resist mask for a wet etching that includes first mask portions, second mask portions, third mask portions, and fourth mask portions on a quartz-crystal wafer, the first mask portions forming a pattern of the AT-cut crystal elements in a matrix, the second mask portions extending along a direction equivalent to the Z'-axis in the matrix to form a pattern for forming crosspieces arranged in sequence along the X direction, the third mask portions forming a bridge pattern to hold the AT-cut crystal elements on the crosspieces after this wet etching, the fourth mask portions being disposed between the corner portions on sides of the second sides of the AT-cut crystal elements and the third mask portions and having a predetermined width W to disappear the crystals at locations of the fourth mask portions at completion of a second etching step (i.e., a subsequently dipping); a first etching step (i.e., previously dipping) of dipping the quartz-crystal wafer on which the etching resist mask has been formed in a hydrofluoric acid-based wet etching liquid for a predetermined period; a step of removing the first mask portions and the fourth mask portions from the quartz-crystal wafer on which the first etching step (i.e., previously dipping the quartz-crystal wafer) has been performed; the second etching step of dipping the quartz-crystal wafer from which the first mask portions and the fourth mask portions have been removed in a hydrofluoric acid-based wet etching liquid for a predetermined period; a step of forming an excitation electrode on the quartz-crystal wafer on which the second etching step has been performed; a step of separating the AT-cut crystal elements from the quartz-crystal wafer on which the excitation electrode has been formed; and a step of connecting and fixing the separated AT-cut crystal elements to the container.

Note that, in the etching resist mask processing step performed before the second etching step, the third mask portions (mask portions for the pattern to form the crosspieces) may be remained, and the second mask portions (mask portions to form the bridge pattern) may be remained or removed according to a size of the second mask portions or the like. That is, even when the second mask portions are removed, the bridges remain even after the second etching step is performed as long as the bridge pattern is large, and therefore the second mask portions may be removed. On the contrary, when the bridge pattern is small, the second mask portions may be remained without being removed, and the relevant parts of the crystal elements may be protected such that the bridges do not disappear in the second etching step.

With this disclosure of the piezoelectric device according to this application, regarding the piezoelectric device using the AT-cut crystal element having the side surface intersecting with the Z'-axis of the crystal constituted of the predetermined first to third surfaces, the piezoelectric device in which the corner portions on the distal end are remained and a plane area of the crystal element is expanded to improve CI compared with that of the conventional one can be provided.

Additionally, with this disclosure of the method for manufacturing the piezoelectric device according to this application, after the mask is formed on the quartz-crystal wafer with the etching resist mask including the predetermined first to fourth mask portions, the first etching is performed on this quartz-crystal wafer, and then the second etching is performed with the first mask portions and the fourth mask portions removed. Therefore, while parts from which the fourth mask portions have been removed of the crystal elements gradually disappear in the second etching, the corner portions on the distal ends of the crystal elements do not disappear. In view of this, while a decrease in the plane area on the distal end side of the crystal element is reduced, the crystal element having the desired side surface having the first to third surfaces can be easily manufactured.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device comprising:
   a container; and
   an AT-cut crystal element that has an X-Z' surface expressed by crystallographic axes of a crystal as a principal surface, a planar shape of the AT-cut crystal element being a quadrangle, the AT-cut crystal element having at least one side surface intersecting with an Z'-axis of a crystallographic axis of the crystal constituted of three surfaces, the three surfaces being first to third surfaces met in an order of the first to third surfaces, the first surface being a surface equivalent to a surface formed by rotating the principal surface by $4°±3.5°$ with an X-axis of the crystal as a rotation axis, the second surface being a surface equivalent to a surface formed by rotating the principal surface by $-57°±5°$ with the X-axis of the crystal as a rotation axis, the third surface being a surface equivalent to a surface formed by rotating the principal surface by $-42°±5°$ with the X-axis of the crystal as a rotation axis, the AT-cut crystal element being connected and secured to the container with a conductive adhesive on a side of a first side among two sides parallel to the Z'-axis, wherein
   when two corner portions on a side of a second side opposed to the first side of the AT-cut crystal element are viewed in plan view, each of the two corner portions have an approximately right angle;
   wherein the second side has a linear shape between the two corner portions;
   wherein when a length of a part of the linear shape is denoted as W1, and a width dimension along a direction of the Z'-axis of the AT-cut crystal element is denoted as W0, W1/W0 is from 0.93 to 0.99.

2. The piezoelectric device according to claim 1, wherein when an angle where the two sides constituting the corner portion intersect is viewed in plan view, the approximately right angle has an angle in a range from 85 to 90 degrees.

3. The piezoelectric device according to claim 1, wherein when a length of a part of the linear shape is denoted as W1, and a width dimension along a direction of the Z'-axis of the AT-cut crystal element is denoted as W0, W1/W0 is from 0.96 to 0.99.

4. The piezoelectric device according to claim 1, wherein the approximately right angles are 20 μm or less in terms of a dimension C as a notation for C-chamfering of the two corner portions.

5. The piezoelectric device according to claim 1, wherein the AT-cut crystal element is an AT-cut crystal element having a rectangular shape in plan view in which the first side and the second side are short sides and sides along an X-axis direction of the crystal are long sides.

6. A manufacturing method of a piezoelectric device that manufactures the piezoelectric device according to claim 1 by a photolithography technique and a wet etching technique, the manufacturing method comprising:

forming an etching resist mask for a wet etching that includes first mask portions, second mask portions, third mask portions, and fourth mask portions on a quartz-crystal wafer, the first mask portions forming a pattern of the AT-cut crystal elements in a matrix, the second mask portions extending along a direction equivalent to the Z'-axis in the matrix to form a pattern for Miming crosspieces arranged in sequence along a direction of the X-axis, the third mask portions forming a bridge pattern to hold the AT-cut crystal elements on the crosspieces after the wet etching, the fourth mask portions being disposed between the corner portions on sides of the second sides of the AT-cut crystal elements and the third mask portions and having a predetermined width W to disappear the crystals at locations of the fourth mask portions at completion of a subsequently dipping;

previously dipping the quartz-crystal wafer on which the etching resist mask has been formed in a hydrofluoric acid-based wet etching liquid for a predetermined period;

removing the first mask portions and the fourth mask portions from the quartz-crystal wafer on which previously dipping the quartz-crystal wafer has been performed;

performing the subsequently dipping that includes dipping the quartz-crystal wafer from which the first mask portions and the fourth mask portions have been removed in a hydrofluoric acid-based wet etching liquid for a predetermined period;

forming an excitation electrode on the quartz-crystal wafer on which the subsequently dipping has been performed;

separating the AT-cut crystal elements from the quartz-crystal wafer on which the excitation electrode has been formed; and connecting and fixing the separated AT-cut crystal elements to the container.

* * * * *